(12) United States Patent
Kim et al.

(10) Patent No.: US 11,307,448 B2
(45) Date of Patent: Apr. 19, 2022

(54) MOBILE TERMINAL

(71) Applicant: LG ELECTRONICS INC., Seoul (KR)

(72) Inventors: Yanghwan Kim, Seoul (KR); Ilkyoung Cho, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 17/057,963

(22) PCT Filed: Oct. 15, 2018

(86) PCT No.: PCT/KR2018/012101
§ 371 (c)(1),
(2) Date: Nov. 23, 2020

(87) PCT Pub. No.: WO2019/240331
PCT Pub. Date: Dec. 19, 2019

(65) Prior Publication Data
US 2021/0200020 A1 Jul. 1, 2021

(30) Foreign Application Priority Data

Jun. 11, 2018 (KR) .................. 10-2018-0066574
Oct. 2, 2018 (KR) .................. 10-2018-0117403

(51) Int. Cl.
*G02F 1/1335* (2006.01)
*G02F 1/1333* (2006.01)
(Continued)

(52) U.S. Cl.
CPC .. *G02F 1/133512* (2013.01); *G02F 1/133331* (2021.01); *G03B 30/00* (2021.01);
(Continued)

(58) Field of Classification Search
CPC ......... G02F 1/133512; G02F 1/133331; G02F 1/1333; G02F 1/133308; G02F 1/1335;
(Continued)

(56) References Cited

U.S. PATENT DOCUMENTS

2019/0079604 A1* 3/2019 Kim .................. G02F 1/133308

FOREIGN PATENT DOCUMENTS

KR 10-2001-0031429 4/2001
KR 10-2015-0052075 5/2015
(Continued)

OTHER PUBLICATIONS

PCT International Application No. PCT/KR2018/012101, International Search Report dated Feb. 28, 2019, 9 pages.

*Primary Examiner* — Donald L Raleigh
(74) *Attorney, Agent, or Firm* — Lee Hong Degerman Kang & Waimey

(57) ABSTRACT

In order to resolve a problem in which, when an electronic component is provided in a hole provided in a display, the light of the display enters the hole or, oppositely, light having entered the hole enters the display, provided is a mobile terminal comprising: a cover glass; a display panel provided on the rear surface of the cover glass so as to have a plurality of layers; a cut-out region formed on at least one of the plurality of layers; a side optical shield film provided on the side surface of the at least one layer exposed to the outside by the cut-out region; and a front optical shield film provided to one region adjacent to the cut-out region of the cover glass.

8 Claims, 12 Drawing Sheets

(51) Int. Cl.
  *G03B 30/00*    (2021.01)
  *H01L 27/32*    (2006.01)
  *H04N 5/225*    (2006.01)
  *H04M 1/02*    (2006.01)

(52) U.S. Cl.
  CPC ........ *H01L 27/326* (2013.01); *H01L 27/3234* (2013.01); *H01L 27/3272* (2013.01); *H04N 5/2254* (2013.01); *H04M 1/0264* (2013.01); *H04M 1/0266* (2013.01)

(58) Field of Classification Search
  CPC ... G03B 30/00; H01L 27/3234; H01L 27/326; H01L 27/3272; H01L 51/5237; H01L 51/529; H04N 5/2254; H04N 5/2257; H04M 1/0264; H04M 1/0266
  See application file for complete search history.

(56) References Cited

FOREIGN PATENT DOCUMENTS

| | | |
|---|---|---|
| KR | 10-2017-0036447 | 4/2017 |
| KR | 10-2017-0073964 | 6/2017 |
| KR | 10-2017-0123904 | 11/2017 |

\* cited by examiner (a)

(b)

(c)

MOBILE TERMINAL

CROSS-REFERENCE TO RELATED APPLICATIONS

This application is the National Stage filing under 35 U.S.C. 371 of International Application No. PCT/KR2018/012101, filed on Oct. 15, 2018, which claims the benefit of earlier filing date and right of priority to Korean Application Nos. 10-2018-0066574, filed on Jun. 11, 2018 and 10-2018-0117403, filed on Oct. 2, 2018, the contents of which are all hereby incorporated by reference herein their entirety.

TECHNICAL FIELD

The present disclosure relates to a mobile terminal having a display including a cut-out area, such as a hole or a notch, defined therein.

BACKGROUND ART

In response to a demand for maximization of a display region, attempts to implement the display regions of various shapes are continuing.

As an example, a camera hole for disposing a camera therein may be implemented in the display region.

When an electronic component is disposed in a hole defined in a display, there may be a problem that light of the display may flow into the hole, or the light that has flowed into the hole may flow into the display, conversely.

DISCLOSURE

Technical Purpose

The present disclosure aims to solve the problem of light inflow that may occur in a display having a hole defined therein, which is the aforementioned problem.

Technical Solutions

According to one aspect of the present disclosure to achieve the above or other purposes, provided is a mobile terminal including a cover glass, a display panel disposed on a rear surface of the cover glass to form a plurality of layers, a cut-out region defined in at least one of the plurality of layers, a side surface optical shielding film disposed on a side surface of the at least one layer exposed to the outside by the cut-out region, and a front surface optical shielding film disposed in a region adjacent to the cut-out region of the cover glass.

Further, according to another aspect of the present disclosure, provided is the mobile terminal, wherein the display panel is a liquid crystal display (LCD) including a liquid crystal layer, wherein the cut-out region is defined in all of the plurality of layers except for the liquid crystal layer, wherein the mobile terminal further includes an auxiliary optical shielding film disposed in a region adjacent to the cut-out region of the liquid crystal layer.

Further, according to another aspect of the present disclosure, provided is the mobile terminal further including an optical sensor disposed inside the cut-out region or at the rear of the cut-out region.

Further, according to another aspect of the present disclosure, provided is the mobile terminal, wherein the optical sensor includes a camera sensor, wherein the camera sensor includes a lens barrel, and an image sensor, wherein the lens barrel is disposed inside the cut-out region, and the image sensor is located at the rear of the cut-out region.

Further, according to another aspect of the present disclosure, provided is the mobile terminal, wherein a backlight unit layer is disposed at a rearmost portion of the display panel, wherein the image sensor is joined to a region adjacent to the cut-out region of a rear surface of the backlight unit layer.

Further, according to another aspect of the present disclosure, provided is the mobile terminal, wherein the display panel includes organic light emitting diodes (OLEDs), wherein a rearmost layer of the display panel is a cushion tape layer, wherein the cushion tape layer is formed wider than the cut-out region to form a seating region of the optical sensor.

Further, according to another aspect of the present disclosure, provided is the mobile terminal, wherein the cut-out region forms a step having a cross-section area increasing forwardly.

Further, according to another aspect of the present disclosure, provided is the mobile terminal, wherein the side surface optical shielding film contains black ink, and is applied to the side surface in a spraying scheme.

Advantageous Effects

Effects of a mobile terminal device according to the present disclosure are as follows.

According to at least one of the embodiments of the present disclosure, light is prevented from entering a display or a camera hole.

Further scope of the applicability of the present disclosure will become apparent from a detailed description below. However, various changes and modifications within the spirit and scope of the present disclosure may be clearly understood by those skilled in the corresponding technical field, so that it is to be understood that the detailed description and specific embodiments such as preferred embodiments of the present disclosure are given by way of example only.

BEST MODE

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1A:
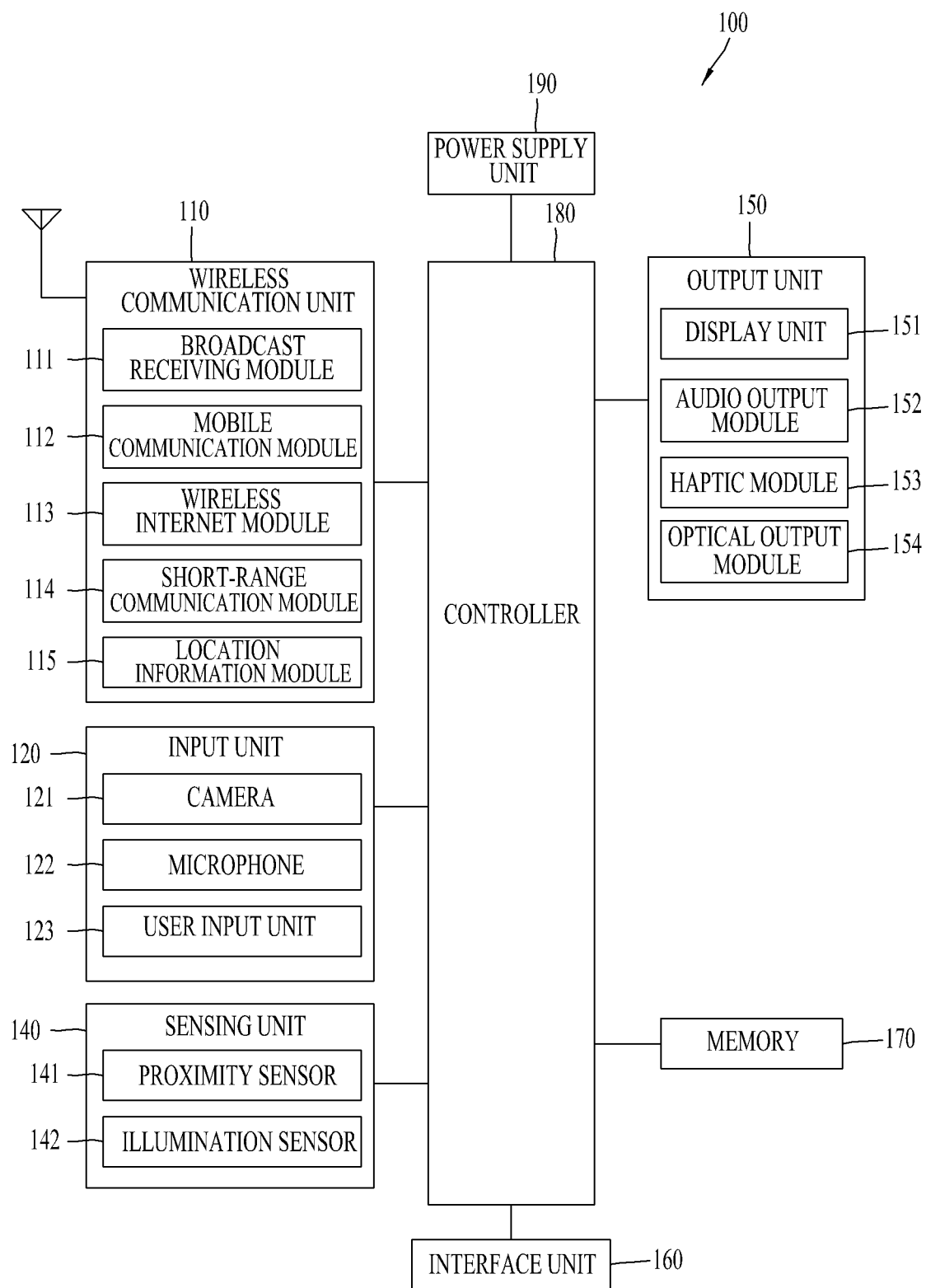
FIG. 1A is a block diagram for illustrating a mobile terminal associated with the present disclosure.
Figure 1B:
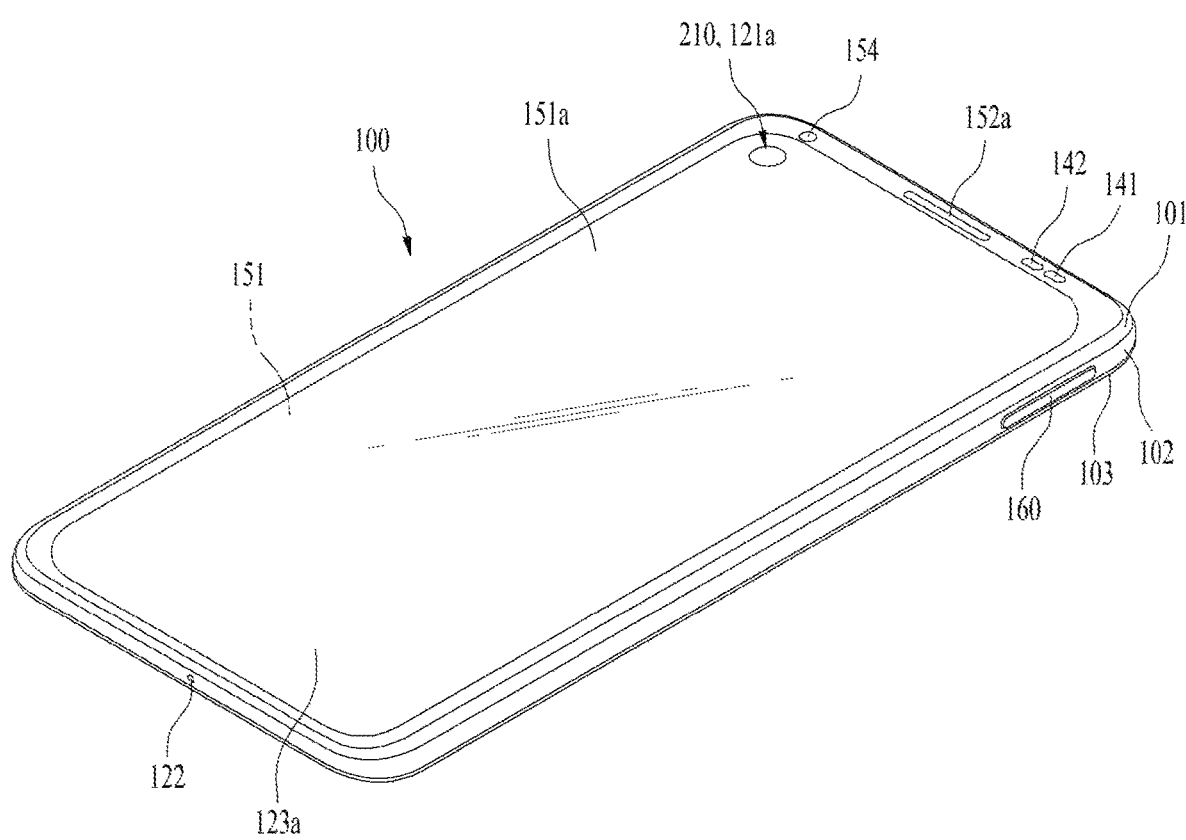
FIGS. 1B and 1C are conceptual diagrams of an example of a mobile terminal associated with the present disclosure viewed from different directions.
Figure 1C:
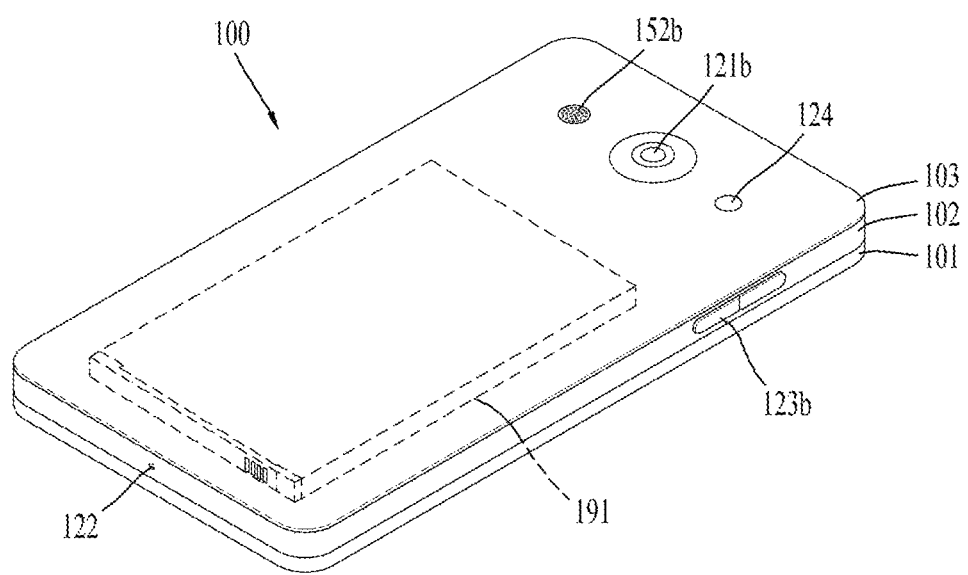

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. Referring now to FIG. 1A, the mobile terminal 100 is shown having wireless communication unit 110 configured with several commonly implemented components. It is understood that implementing all of the illustrated components is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

Here, the terminal body may be understood to refer to the concept of this bore a mobile terminal (100) to at least one of the aggregate.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include the display unit 151, the first and second audio output modules 152a and 152b, the proximity sensor 141, the illuminance sensor 142, the optical output module 154, the first and second cameras 121a and 121b, the first and second manipulation units 123a and 123b, the microphone 122 and the interface unit 160.

It will be described for the mobile terminal as shown in FIGS. 1B and 1C. The display unit 151, the first audio output module 152a, the proximity sensor 141, an illumination sensor 142, the optical output module 154, the first camera 121a and the first manipulation unit 123a are arranged in front surface of the terminal body, the second manipulation unit 123b, the microphone 122 and interface unit 160 are arranged in side surface of the terminal body, and the second audio output modules 152b and the second camera 121b are arranged in rear surface of the terminal body.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151*a* and a display on a rear surface of the window 151*a*, or a metal wire which is patterned directly on the rear surface of the window 151*a*. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123*a*.

The first audio output module 152*a* may be implemented in the form of a speaker to output voice audio, alarm sounds, multimedia audio reproduction, and the like.

The window 151*a* of the display unit 151 will typically include an aperture to permit audio generated by the first audio output module 152*a* to pass. One alternative is to allow audio to be released along an assembly gap between the structural bodies (for example, a gap between the window 151*a* and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121*a* can process image frames such as still or moving images obtained by the image sensor in a capture mode or a video call mode. The processed image frames can then be displayed on the display unit 151 or stored in the memory 170.

The first and second manipulation units 123*a* and 123*b* are examples of the user input unit 123, which may be manipulated by a user to provide input to the mobile terminal 100. The first and second manipulation units 123*a* and 123*b* may also be commonly referred to as a manipulating portion, and may employ any tactile method that allows the user to perform manipulation such as touch, push, scroll, or the like. The first and second manipulation units 123*a* and 123*b* may also employ any non-tactile method that allows the user to perform manipulation such as proximity touch, hovering, or the like.

FIG. 1B illustrates the first manipulation unit 123*a* as a touch key, but possible alternatives include a mechanical key, a push key, a touch key, and combinations thereof.

Input received at the first and second manipulation units 123*a* and 123*b* may be used in various ways. For example, the first manipulation unit 123*a* may be used by the user to provide an input to a menu, home key, cancel, search, or the like, and the second manipulation unit 123*b* may be used by the user to provide an input to control a volume level being output from the first or second audio output modules 152*a* or 152*b*, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152*a* or 152*b*, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123*a* in the rear input unit. As such, in situations where the first manipulation unit 123*a* is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121*b* is shown located at the rear side of the terminal body and includes an image capturing direction that is substantially opposite to the image capturing direction of the first camera unit 121*a*. If desired, second camera 121*a* may alternatively be located at other locations, or made to be movable, in order to have a different image capturing direction from that which is shown.

The second camera 121*b* can include a plurality of lenses arranged along at least one line. The plurality of lenses may also be arranged in a matrix configuration. The cameras may be referred to as an "array camera." When the second camera 121*b* is implemented as an array camera, images may be captured in various manners using the plurality of lenses and images with better qualities.

A flash 124 is shown located adjacent to the second camera 121*b*. When an image of a subject is captured with the camera 121*b*, the flash 124 may illuminate the subject.

The second audio output module 152*b* can be located on the terminal body. The second audio output module 152*b* may implement stereophonic sound functions in conjunction with the first audio output module 152*a*, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (see FIG. 1A). may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

Figure 2:
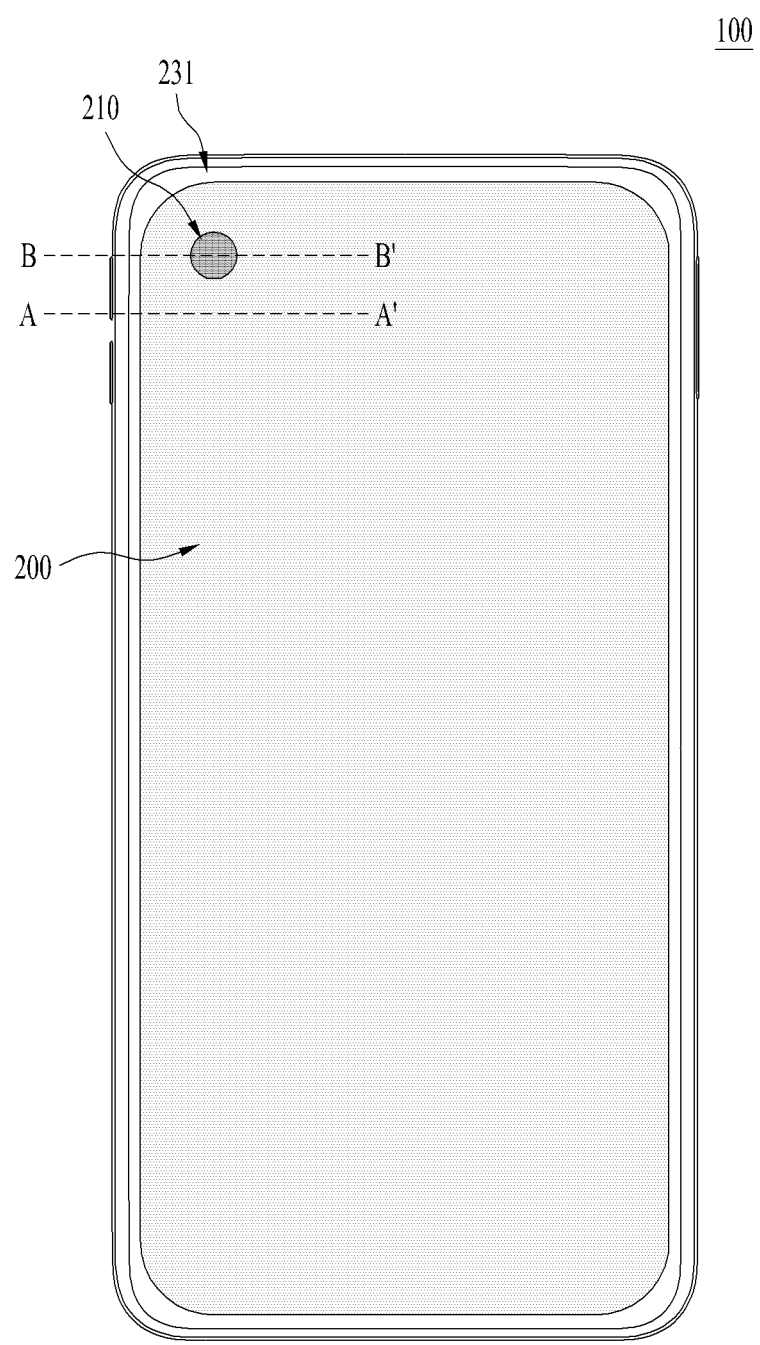
FIG. 2 is a front view of a mobile terminal associated with the present disclosure.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen FIG. 2 is a front view of the mobile terminal 100 associated with the present disclosure.

On a front surface of the mobile terminal 100, a front camera, a proximity sensor, a receiver, a light output unit, a display 200, and the like are arranged.

The display 200 may have a similar meaning to the above-described display unit 151, but is a more close to a concept of a region.

Conventionally, the display 200 and the remaining components are separated from each other, and the remaining components are arranged in a bezel 231. However, in response to a recent demand for minimizing the bezel 231 and maximizing a region of the display 200, a form in which at least some of the remaining components are arranged inside the display 200 appears.

In order to mount some components inside the display 200, the display 200 may define a cut-out region 210 therein. For example, the cut-out region 210 may become a notch region of a notch display or a hole region in the display 200 as shown in FIG. 2.

In the embodiments of the present disclosure, it is assumed that the cut-out region 210 has the hole region defined inside the display 200 as shown in FIG. 2. However, the present disclosure may not be limited thereto, and may be applied to all forms in which the cut-out region 210 is defined in the display 200, such as the above-described notch display form.

Figure 3:
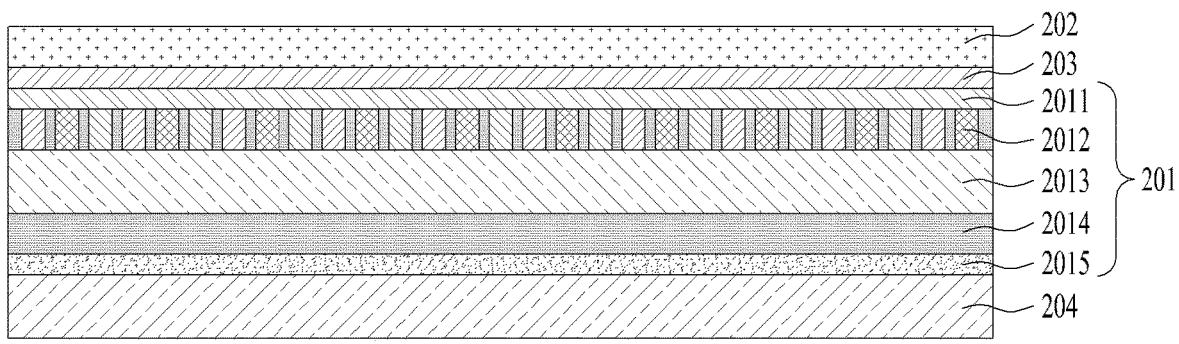
FIG. 3 is a cross-sectional view illustrating an embodiment of FIG. 2 in a direction A-A'.
Figure 4:
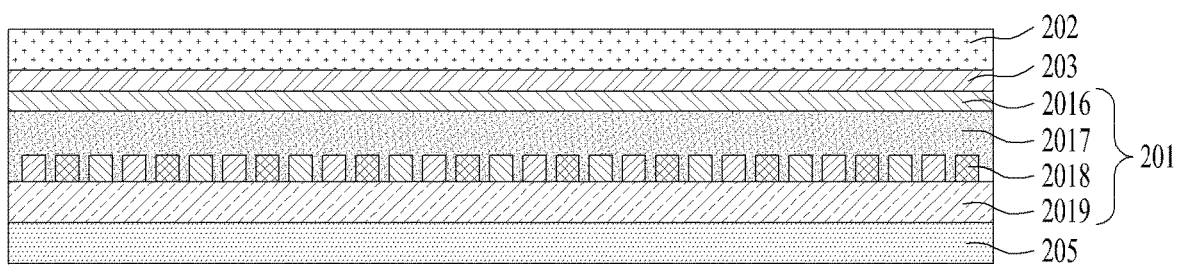
FIG. 4 is a cross-sectional view illustrating another embodiment of FIG. 2 in a direction A-A'.

FIG. 3 is a cross-sectional view illustrating an embodiment of FIG. 2 in a direction A-A', and FIG. 4 is a cross-sectional view illustrating another embodiment of FIG. 2 in a direction A-A'. For convenience of description, reference is made to FIG. 2 together.

The mobile terminal 100 has a display panel 201. A cover glass 202 for protecting the display panel 201 may be disposed on a front surface of the display panel 201. An optically clear adhesive (OCA) film 203 for bonding of both components may be disposed between the display panel 201 and the cover glass 202.

As shown in FIG. 3, in a case of the display panel 201 in a form of a liquid crystal display (LCD), a backlight unit 204 is disposed on a rear surface of the display panel 201.

The display panel 201 is formed in a stacked structure of a plurality of layers.

The display panel 201 in the LCD form may be formed as a top polarizing plate 2011, a color filter (C/F) layer 2012, a liquid crystal 2013, a thin film transistor (TFT) layer 2014, and a bottom polarizing plate 2015 are stacked in order from a front surface of the display panel 201.

The color filter layer 2012 selectively transmits light emitted from the backlight unit 204 in RGB. The liquid crystal 2013 rotates and serves to transmit or block the light. The TFT layer 2014 serves to rotate the liquid crystal 2013 by forming an electric field in the liquid crystal 2013.

In one example, the display panel 201 in an OLED form as shown in FIG. 4 is formed as a polarizing plate 2016, an encapsulation 2017, a thin film transistor (TFT) 2018, and a poly-imide (PI) layer 2019 are stacked in order from the front surface of the display panel 201. Unlike the LCD display panel 201, a cushion tape 205 may be disposed on the rear surface of the OLED display panel 201 instead of the backlight unit 204.

Some of the components of the display panel 201 in the OLED form that are also arranged in the display panel 201 in the LCD form perform the same roles as the components of the display panel 201, so that a duplicate description will be omitted. The encapsulation 2017 refers to an organic or inorganic layer that protects an OLED from moisture or impurities. The TFT 2018 constitutes an internal circuit that drives each pixel. The PI layer 2019 serves as a substrate for depositing the TFT 2018, the OLED, and the encapsulation 2017. The cushion tape 205 serves to alleviate an impact applied to the display panel 201 and reduce heat generation.

Figure 5:
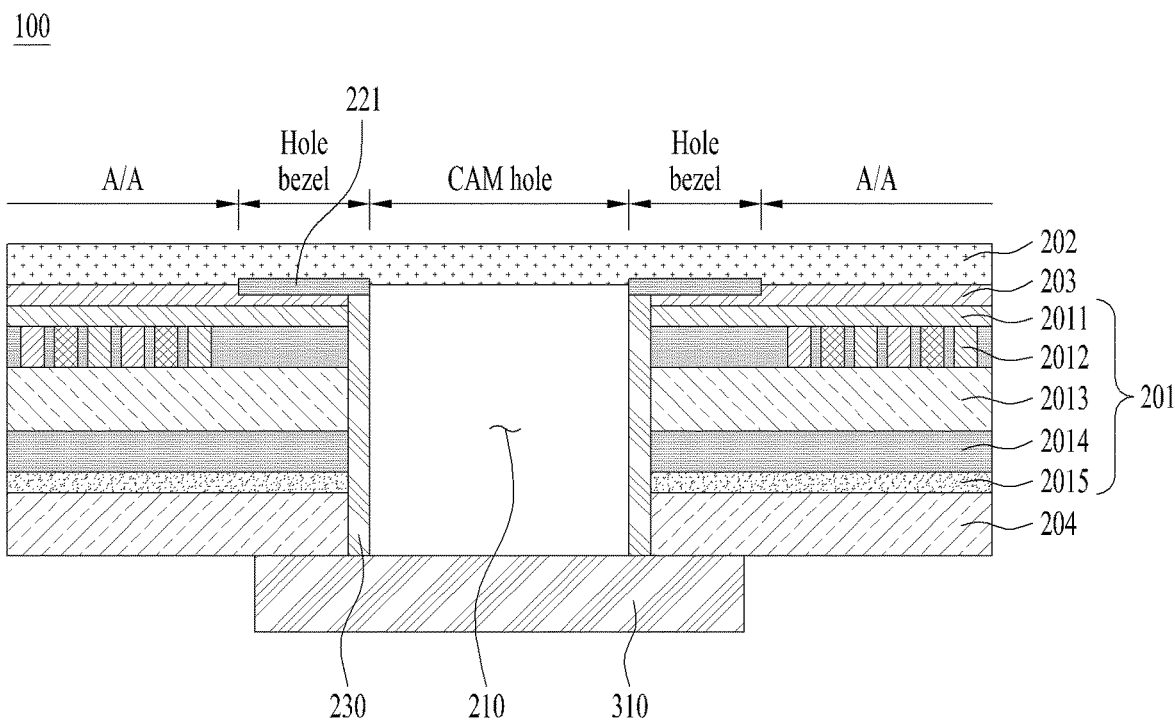
FIGS. 5 and 6 are two embodiments of a cross-section in a direction B-B' of FIG. 2 on the premise that a display panel is an LCD display panel.
Figure 6:
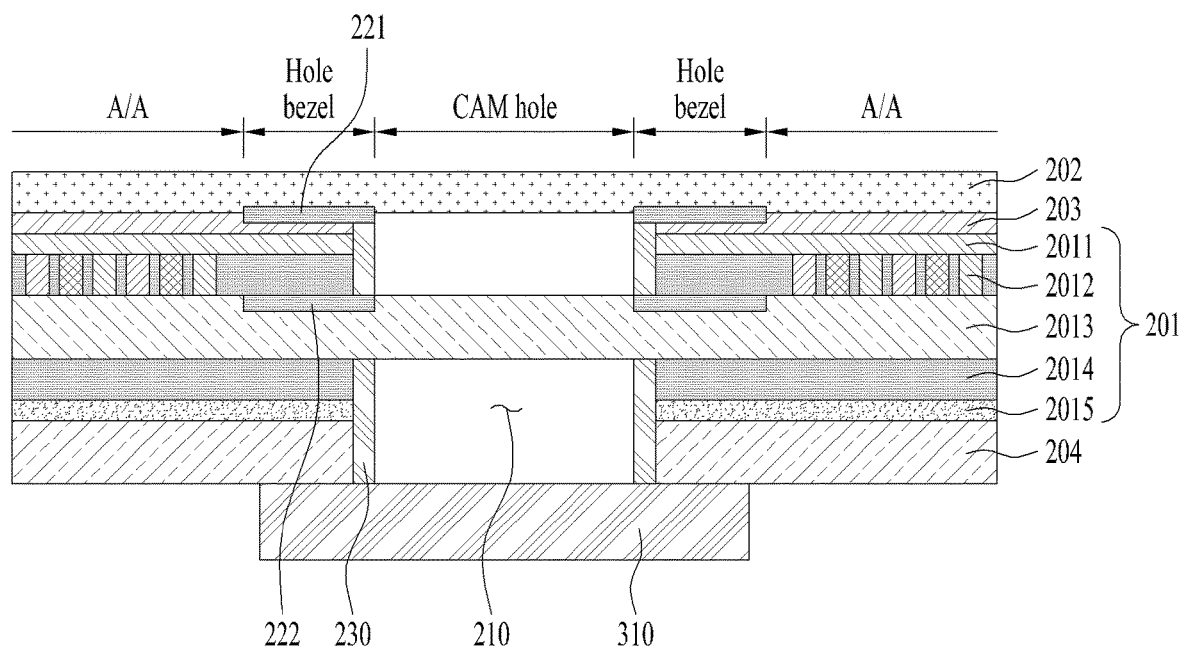

FIGS. 5 and 6 are two embodiments of a cross-section in a direction B-B' of FIG. 2 on the premise that the display panel is the LCD display panel 201.

The cut-out region 210 for mounting an electronic component 310 therein may be defined in at least one of the plurality of layers of the display panel 201 described above.

The electronic component 310 mounted in the cut-out region 210 therein may be at least one of the components such as the front camera, the proximity sensor, the receiver, and the light output unit described above.

The cut-out region 210 may be protected from the outside by the cover glass 202 positioned at the front surface of the mobile terminal 100.

A front surface optical shielding layer 221 may be disposed in one region of the cover glass 202 adjacent to the cut-out region 210. The front surface optical shielding layer 221 mainly serves to prevent a region in which a screen is not output from being visually recognized from the outside.

A side surface optical shielding film 230 may be disposed on a side surface of at least one layer having the cut-out region 210 defined therein of the display panel 201.

The side surface optical shielding film 230 prevents the light from flowing from the display panel 201 to the cut-out region 210 or prevents the light in the cut-out region 210 from flowing to the display panel 201.

The side surface optical shielding film 230 is particularly necessary when the electronic component 310 is the optical sensor such as the camera, the proximity sensor, or the like. When the optical sensor senses an object outside the mobile terminal 100 through the cover glass 202, generation of noise in sensing resulted from the light of the display panel 201 may be prevented.

The side surface optical shielding film 230 may be made of a black material. The side surface optical shielding film 230 of the black material absorbs the light better than a case not made of the black material, thereby minimizing transmission or reflection of the light.

It is preferable that the side surface optical shielding film 230 is disposed on an entire inner circumferential surface of the cut-out region 210.

As shown in the embodiment of FIG. 5, when the entire plurality of layers of the display panel 201 define the cut-out region 210 therein, the side surface optical shielding film 230 is formed on side surfaces of the entire layers. When some layers of the display panel 201 do not define the cut-out region 210 therein as in the embodiment of FIG. 6, the side surface optical shielding film 230 is formed only on side surfaces of layers except for the layers that do not define the cut-out region 210 therein. The layer not defining the cut-out region 210 therein may become the liquid crystal 2013 in particular.

As shown in FIG. 6, when the liquid crystal 2013 does not define the cut-out region 210, a separate cutting process is not required. Therefore, there is an advantage that a high process yield may be obtained.

However, in the case of the embodiment of FIG. 6, the side surface optical shielding film 230 is not able to be disposed on the layer in which the cut-out region 210 is not defined. Accordingly, the light inside of the cut-out region 210 and the light of the display panel 201 may communicate through the corresponding layer. To minimize this, an auxiliary optical shielding film 222 may be disposed in one region adjacent to the cut-out region 210 of the corresponding layer.

Because of the auxiliary optical shielding film 222, it is possible to minimize diffused reflection of the light on the corresponding layer. The auxiliary optical shielding film 222 may be disposed on a front surface of the corresponding layer that does not define the cut-out region 210 therein, may be disposed on a rear surface thereof, or may be disposed on both surfaces thereof in some cases.

A width in a left and right direction of the auxiliary optical shielding film 222 may be the same as a width in the left and right direction of the front surface optical shielding film 221 described above. This is to minimize a probability of the diffused reflection of the light while minimizing increase of the non-output region resulted from the provision of the corresponding shielding film.

Figure 7:
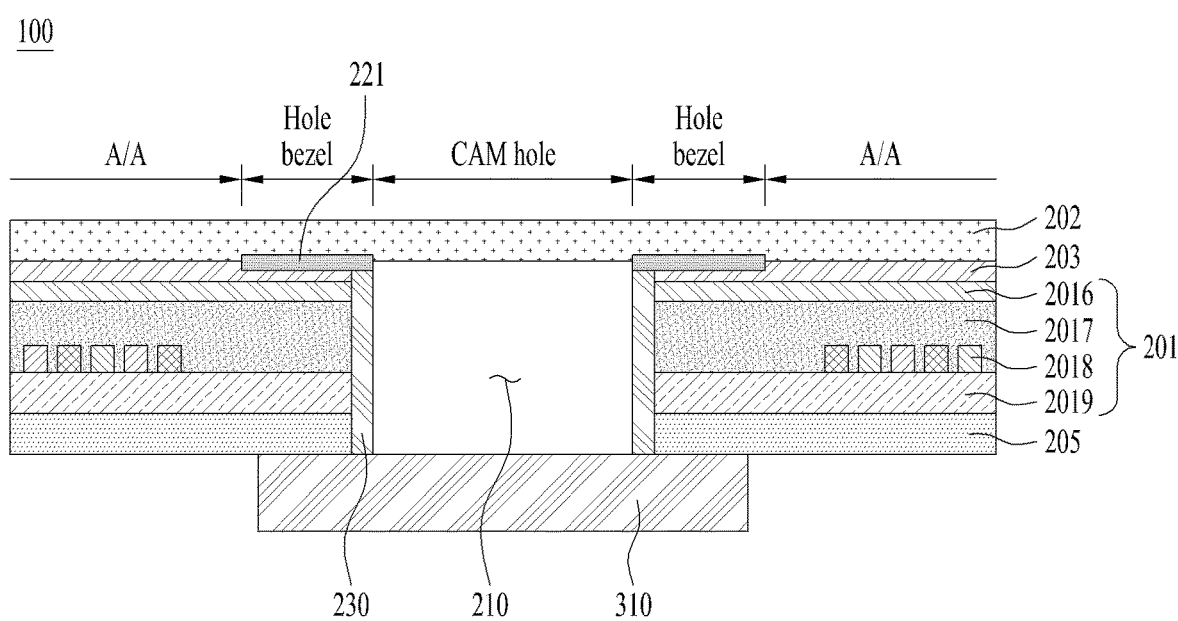
FIGS. 7 and 8 are two embodiments of a cross-section in a direction B-B' of FIG. 2 on the premise that a display panel is an OLED display panel.
Figure 8:
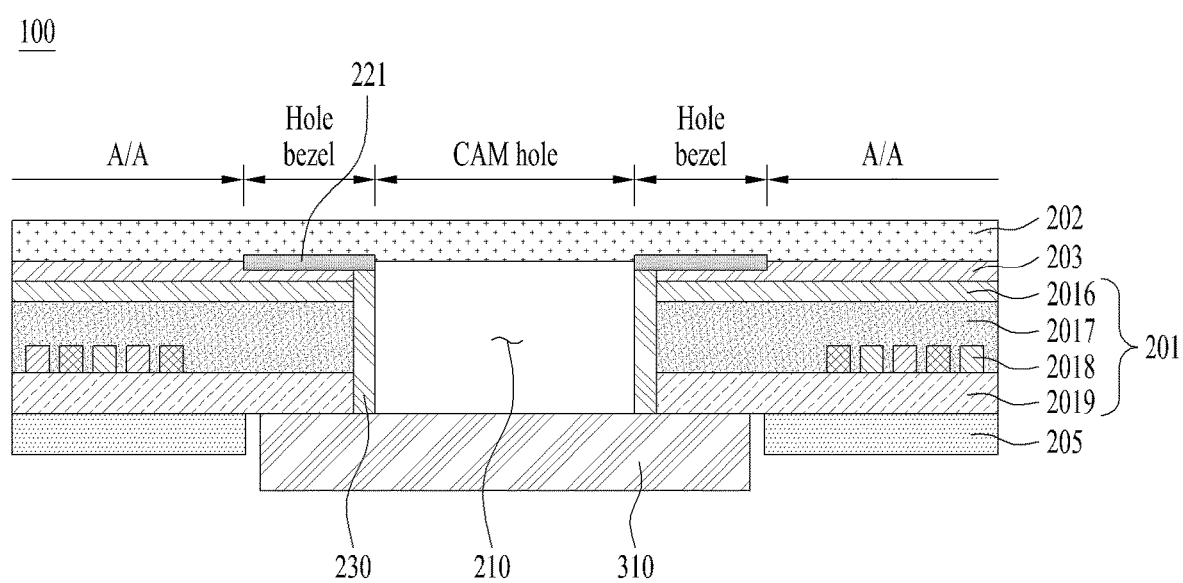

FIGS. 7 and 8 are two embodiments of a cross-section in a direction B-B' of FIG. 2 on the premise that a display panel is the OLED display panel 201.

The features of the cut-out region 210 in the above-described LCD display panel 201 may be equally applied to the OELD display panel 201 within a range not contradictory.

The electronic component 310 disposed in the cut-out region 210 of the display panel 201 may be a camera sensor 311.

The camera sensor 311 may correspond to the first camera 121a or the second camera 121b described above.

The camera sensor 311 includes a lens barrel 3111 for mounting lenses thereon, and an image sensor 3112 positioned at the rear of the lens barrel 3111.

The lens barrel 3111 may be disposed in the cut-out region 210, and the image sensor 3112 may be disposed at the rear of the cut-out region 210. When the image sensor 3112 or a bracket including the image sensor 3112 is disposed at the rear of the cut-out region 210, the camera sensor 311 may be prevented from being deviated through the cut-out region 210 and the camera sensor 311 may be fixed to the display panel 201.

An adhesive material for mutual fixation may be disposed between the image sensor 3112 and the rear surface of the display panel 201.

FIG. 7 shows a form in which the image sensor 3112 is fixed to a rear surface of the cushion tape 205 located at the rearmost portion of the display panel 201. Further, FIG. 8 shows a form in which the cushion tape 205 is removed from a region corresponding to the image sensor 3112 to be seated and the display panel 201 and the image sensor 3112 are fixed to each other.

In the case of FIG. 7, because the cushion tape 205 is disposed over an entire region, there is an advantage of reducing not only an external shock but also a shock from the image sensor 3112.

On the other hand, in the case of FIG. 8, there is an effect of reducing a thickness of an entire structure as much as a thickness of the cushion tape 205.

Figure 9:
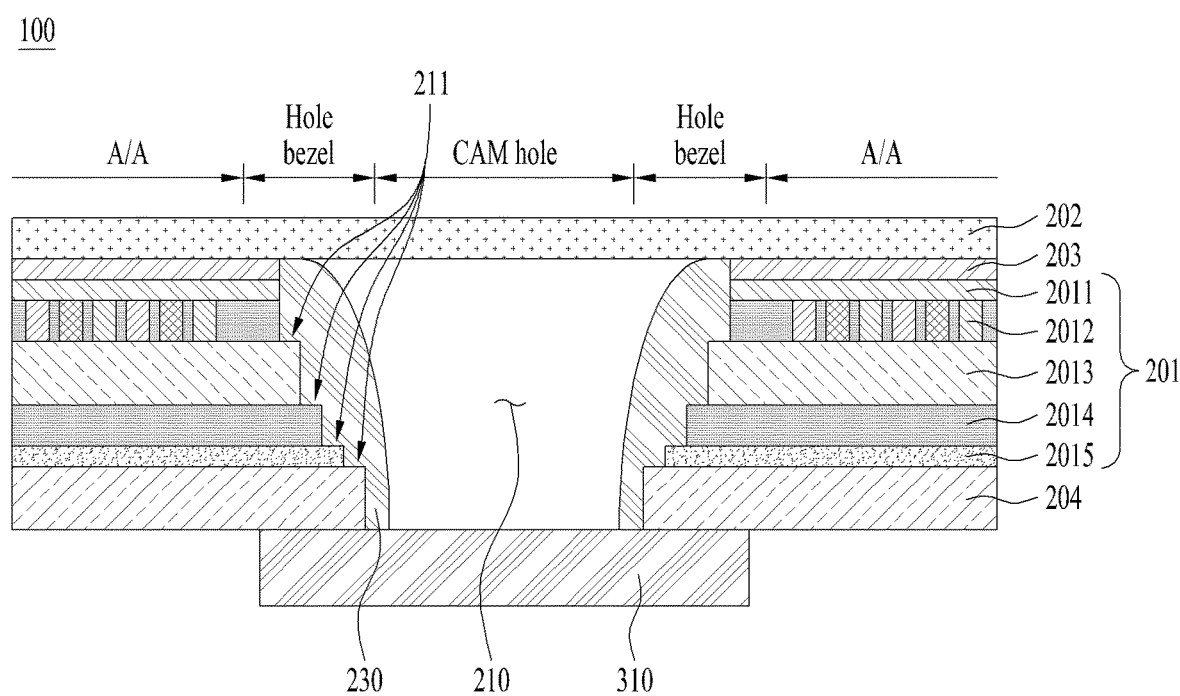
FIG. 9 illustrates another embodiment of a cross-section in a direction B-B' of FIG. 2.

FIG. 9 illustrates another embodiment of a cross-section in a direction B-B' of FIG. 2.

The embodiment of FIG. 9 shows a modified state of the embodiment of FIG. 5. Within a range that is not contradictory, the plurality of layers defining the cut-out region 210 therein may form a step 211 in which a cross-section area thereof becomes wider in a forward direction.

When forming the step 211, when black ink for forming the side surface optical shielding film 230 is applied from a region in front of the cut-out region 210, the black ink is spread evenly without a layer from which printing is omitted, thereby improving shielding reliability. In addition, because a shape of such step 211 corresponds to an angle of view of the optical sensor such as the camera sensor, it is possible to prevent a display output region from being reduced.

Figure 10:
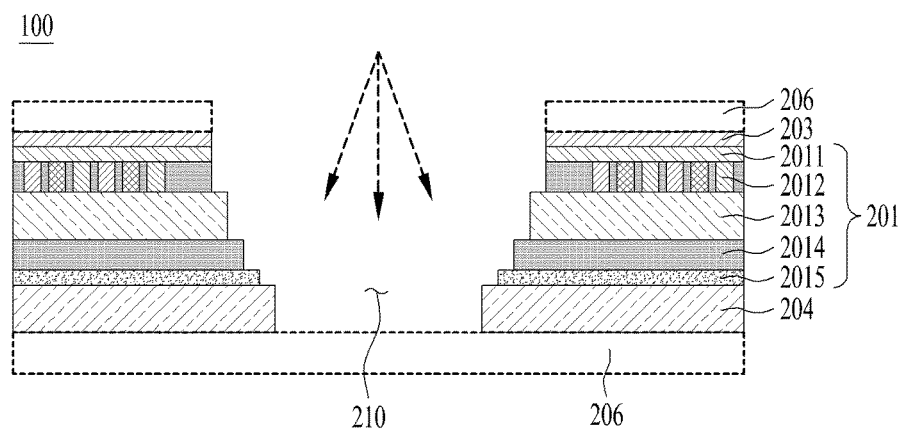
FIG. 10 is a diagram illustrating a sequence of processes for forming a mobile terminal of FIG. 9.
Figure 10:
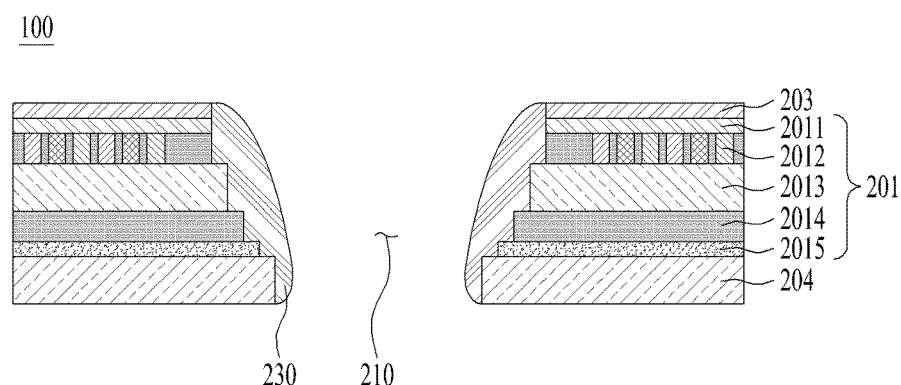
Figure 10:
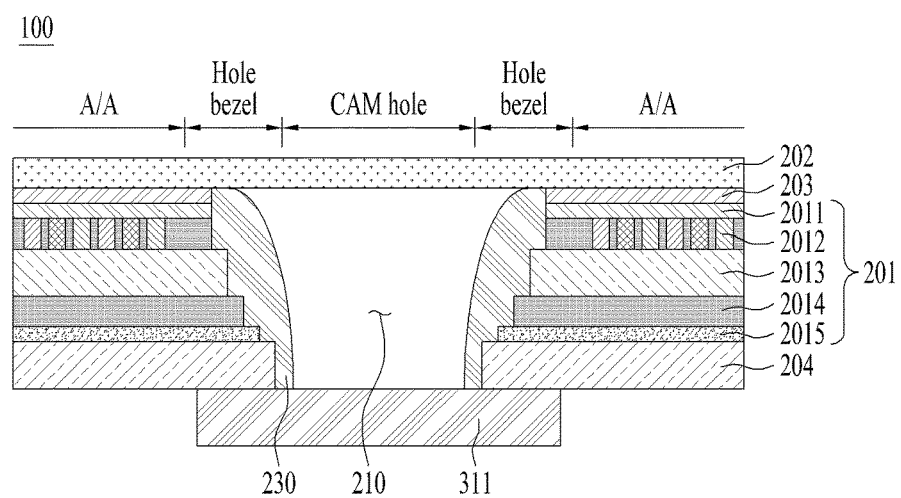

FIG. 10 is a diagram illustrating a sequence of processes for forming the mobile terminal 100 of FIG. 9.

Referring to (a) in FIG. 10, each protective film 206 may be coupled to each of front and rear surfaces of an assembly of the display panel 201 and the backlight unit 204 except for the cover glass 202. The black ink may be applied to the assembly to which the protective film 206 is coupled from a region in front of the assembly.

Thereafter, the applied black ink may undergo a curing process.

Referring to (b) in FIG. 10, the protective films 206 of the front surface and the rear surface are removed from the assembly that has been cured. In the process of removing the protective film 206, the ink region that was unnecessarily applied is also removed.

Referring to (c) in FIG. 10, the cover glass 202 is coupled to the assembly from which the protective film 206 is removed. In this connection, the front surface optical shielding film described above may be printed on a rear surface of the cover glass 202. The cover glass 202 is coupled to the display panel 201, and is required to be positioned such that the front surface optical shielding film of the cover glass 202 is not covered in the angle of view of the optical sensor such as the camera sensor 311.

It is obvious to a person skilled in the art that the present disclosure may be embodied in other specific forms without departing from the spirit and essential characteristics of the present disclosure.

The scope of the present disclosure should be determined by reasonable interpretation of the appended claims, and all changes within the scope of the present disclosure are included in the scope of the present disclosure.

What is claimed is:

1. A mobile terminal comprising:
    a cover glass;
    a display panel disposed on a rear surface of the cover glass to form a plurality of layers;
    a cut-out region defined in at least one of the plurality of layers;
    a side surface optical shielding film disposed on a side surface of the at least one layer exposed to the outside by the cut-out region; and
    a front surface optical shielding film disposed in a region adjacent to the cut-out region of the cover glass.

2. The mobile terminal of claim 1, wherein the display panel is a liquid crystal display (LCD) including a liquid crystal layer,
    wherein the cut-out region is defined in all of the plurality of layers except for the liquid crystal layer,
    wherein the mobile terminal further includes an auxiliary optical shielding film disposed in a region adjacent to the cut-out region of the liquid crystal layer.

3. The mobile terminal of claim 1, further comprising:
    an optical sensor disposed inside the cut-out region or at the rear of the cut-out region.

4. The mobile terminal of claim 3, wherein the optical sensor includes a camera sensor,
    wherein the camera sensor includes:
        a lens barrel; and
        an image sensor,
        wherein the lens barrel is disposed inside the cut-out region, and the image sensor is located at the rear of the cut-out region.

5. The mobile terminal of claim 4, wherein a backlight unit layer is disposed at a rearmost portion of the display panel,
    wherein the image sensor is joined to a region adjacent to the cut-out region of a rear surface of the backlight unit layer.

6. The mobile terminal of claim 3, wherein the display panel includes organic light emitting diodes (OLEDs),
    wherein a rearmost layer of the display panel is a cushion tape layer,
    wherein the cushion tape layer is formed wider than the cut-out region to form a seating region of the optical sensor.

7. The mobile terminal of claim 1, wherein the cut-out region forms a step having a cross-section area increasing forwardly.

8. The mobile terminal of claim 7, wherein the side surface optical shielding film contains black ink, and is applied to the side surface in a spraying scheme.

* * * * *